United States Patent
Bash et al.

(10) Patent No.: US 7,568,360 B1
(45) Date of Patent: Aug. 4, 2009

(54) AIR RE-CIRCULATION EFFECT REDUCTION SYSTEM

(75) Inventors: Cullen E. Bash, Los Gatos, CA (US); Chandrakant D. Patel, Fremont, CA (US); Ratnesh K. Sharma, Union City, CA (US); Abdlmonem Beitelmal, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 694 days.

(21) Appl. No.: 11/264,772

(22) Filed: Nov. 1, 2005

(51) Int. Cl.
*F25D 17/04* (2006.01)
*F25D 23/12* (2006.01)
*F24F 11/00* (2006.01)

(52) U.S. Cl. ............... 62/186; 62/259.2; 236/49.3; 454/239; 361/696

(58) Field of Classification Search ............ 62/186, 62/259.3, 259.2; 236/49.3; 454/228, 229, 454/233, 236, 238, 239, 240; 361/696
See application file for complete search history.

(56) References Cited

U.S. PATENT DOCUMENTS

| | | |
|---|---|---|
| 6,694,759 B1 | 2/2004 | Bash et al. |
| 6,747,872 B1 | 6/2004 | Patel et al. |
| 6,775,997 B2 * | 8/2004 | Bash et al. ............... 62/180 |
| 2005/0187664 A1 | 8/2005 | Bash et al. |
| 2006/0168975 A1 * | 8/2006 | Malone et al. ........... 62/180 |
| 2007/0125107 A1 * | 6/2007 | Beam ...................... 62/186 |

* cited by examiner

*Primary Examiner*—Marc E Norman

(57) ABSTRACT

A system for reducing effects of adverse air re-circulation in a room containing at least one heat generating component includes an air conditioning unit configured to cool airflow in the room and at least one cooling vent tile operable to deliver the cooled airflow to the at least one heat generating component. The system also includes at least one secondary vent tile positioned and operated to one of, introduce airflow into a re-circulating airflow and remove airflow from a re-circulating airflow, to thereby respectively divert or vary the temperature of the re-circulating airflow and thereby reduce the effects of air re-circulation in the room.

21 Claims, 6 Drawing Sheets

AIR RE-CIRCULATION EFFECT REDUCTION SYSTEM

BACKGROUND

A data center may be defined as a location, for instance, a room that houses computer systems arranged in a number of racks. A standard rack, for instance, an electronics cabinet, is defined as an Electronics Industry Association (EIA) enclosure, 78 in. (2 meters) wide, 24 in. (0.61 meter) wide and 30 in. (0.76 meter) deep. These racks are configured to house a number of computer systems, about forty (40) systems, with future configurations of racks being designed to accommodate 200 or more systems. The computer systems typically dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

Data centers are typically equipped with a raised floor with ventilation tiles configured to provide cool air to the computer systems from a pressurized plenum in the space below the raised floor. Conventional data centers are also typically designed to cause airflow heated by the computer systems to be returned to air conditioning units to be cooled, such that the cooled air may be used to again cool the computer systems. Oftentimes, however, the heated airflow is supplied back into the computer systems, thereby reducing the efficiencies at which the computer systems are cooled. In addition, the cooled airflow oftentimes does not flow through the computer systems, but instead, flows back into the air conditioning units, thereby reducing the efficiencies at which the air conditioning units operate.

As such, a system that increases the efficiency of air conditioning units in cooling computer systems would be desirable.

SUMMARY OF THE INVENTION

A system for reducing effects of adverse air re-circulation in a room containing at least one heat generating component is described herein. The system includes an air conditioning unit configured to cool airflow in the room and at least one cooling vent tile operable to deliver the cooled airflow to the at least one heat generating component. The system also includes at least one secondary vent tile positioned and operated to one of, introduce airflow into a re-circulating airflow and remove airflow from a re-circulating airflow, to thereby respectively divert or vary the temperature of the re-circulating airflow and thereby reduce the effects of air re-circulation in the room.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

The adverse effects of air re-circulation in a room containing heat generating devices, such as, hot spot formations, may substantially be reduced through implementation of the systems and methods described herein below. More particularly, secondary vent tiles may be positioned and operated to one or both of change the pressure distribution of re-circulating airflow to thereby divert the airflow and mix cooler airflow into the re-circulating airflow to thereby reduce the temperature of the re-circulating airflow. The secondary vent tiles may change the pressure distribution of the re-circulating airflow by either introducing a diverting airflow into the re-circulating airflow or by removing the re-circulating airflow. By substantially reducing the adverse effects of air re-circulation as described herein, the amount of energy required to cool the heat generating devices may also be substantially reduced and compaction of the heat generating devices may substantially be increased.

Figure 1A:
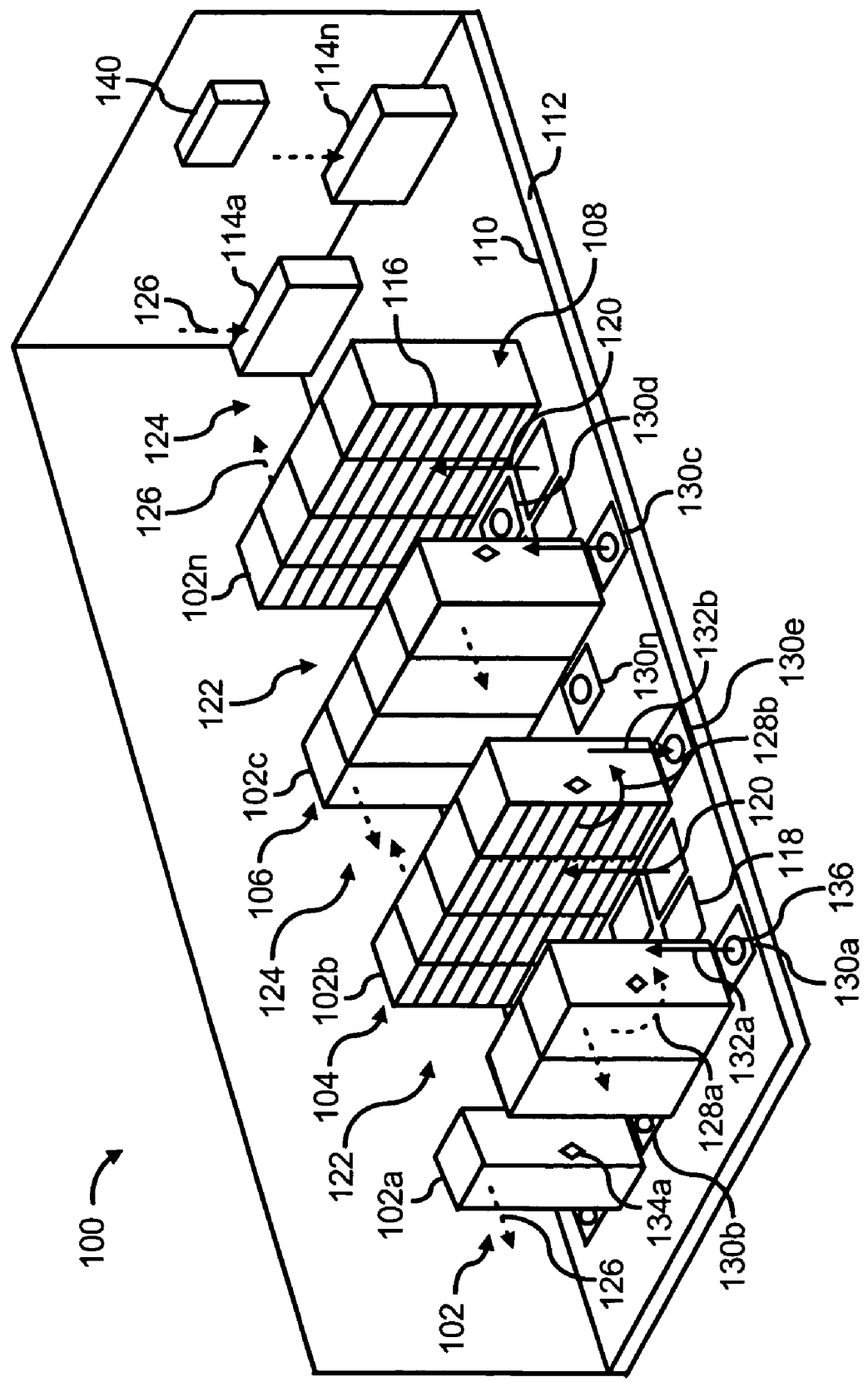
FIG. 1A shows a simplified perspective view of a room according to an embodiment of the invention.

With reference first to FIG. 1A, there is shown a simplified perspective view of a section of a room 100, such as a data center, which may employ various examples of the invention. The terms "data center" are generally meant to denote a room or other space where one or more components capable of generating heat may be situated. In this respect, the terms "data center" are not meant to limit the invention to any specific type of room where data is communicated or processed, nor should it be construed that use of the terms "data center" limits the invention in any respect other than its definition herein above.

It should be readily apparent that the room 100 depicted in FIG. 1A represents a generalized illustration and that other components may be added or existing components may be removed or modified without departing from a scope of the room 100. For example, the room 100 may include any number of racks and various other components. In addition, it should also be understood that heat generating/dissipating components may be located in the room 100 without being housed in racks.

The room 100 is depicted as having a plurality of heat generating devices 102a-102n, where "n" is an integer greater than one. The heat generating devices 102a-102n may comprise, for instance, electronics cabinets, aligned in parallel rows. Each of the rows 102-108 of heat generating devices 102*a*-102*n* is shown as containing a plurality of heat generating devices 102*a*-102*n* positioned on a raised floor 110. Wires and communication lines (not shown) may be located in a space 112 beneath the raised floor 110. The heat generating devices 102*a*-102*n* are generally configured to house a plurality of components 116 capable of generating/dissipating heat, for instance, processors, micro-controllers, high-speed video cards, memories, semi-conductor devices, and the like. The heat generating components 116 may be elements of a plurality of subsystems (not shown), for instance, computers, servers, etc. The subsystems and the components may be implemented to perform various electronic, for instance, computing, switching, routing, displaying, and the like, functions.

The space 112 below the raised floor 110 may also function as a plenum for delivery of cooled air from one or more air conditioning (AC) units 114*a*-114*n*, where "n" is an integer greater than one, to the heat generating devices 102*a*-102*n*. The cooled air may be delivered from the space 112 to the heat generating devices 102*a*-102*n* through cooling vent tiles 118 located between some or all of the heat generating devices 102*a*-102*n*, as indicated by the arrows 120. The cooling vent tiles 118 are shown as being located between rows 102 and 104 and 106 and 108. In this regard, cooling airflow 120 may flow through the heat generating devices 102*a*-102*n* and absorb heat from the heat generating components 116 to thereby cool the heat generating components 116. The manners in which the cooling airflow 120 is supplied to the heat generating devices 102*a*-102*n* may vary and may depend upon any number of factors, including, for instance, cost, configuration, equipment sensitivity, etc. An example of a suitable cooling provisioning scheme may be found in commonly assigned U.S. Pat. No. 6,574,104, the disclosure of which is hereby incorporated by reference in its entirety.

The areas between the rows 102 and 104 and between the rows 106 and 108 may comprise cool aisles 122. These aisles are considered "cool aisles" because they are configured to receive the cooling airflow 120 from the cooling vent tiles 118. In addition, the heat generating devices 102*a*-102*n* generally receive cooling airflow from the cool aisles 122. The aisles between the rows 104 and 106, and on the rear sides of rows 102 and 108, are considered hot aisles 124. These aisles are considered "hot aisles" because they are positioned to receive air that has been heated by the heat generating components 116 in the heat generating devices 102*a*-102*n*, as indicated by the arrows 126.

The sides of the heat generating devices 102*a*-102*n* that face the cool aisles 122 may be considered as the fronts or the inlets of the heat generating devices 102*a*-102*n* and the sides of the heat generating devices 102*a*-102*n* that face away from the cool aisles 122 may be considered as the rears or the outlets of the heat generating devices 102*a*-102*n*. For purposes of simplicity and not of limitation, this nomenclature will be relied upon throughout the present disclosure to describe the various sides of the heat generating devices 102*a*-102*n*.

Although not shown, some or all of the heat generating devices 102*a*-102*n* may be positioned to each face the same direction, such that there are no distinct "hot aisles" and "cool aisles". Additionally, some or all of the heat generating devices 102*a*-102*n* may be positioned with their rear sides adjacent to one another. In this example, the cooling vent tiles 118 may be provided in each aisle 122 and 124. In addition, the heat generating devices 102*a*-102*n* may comprise outlets on top panels thereof to enable heated air to flow out of the heat generating devices 102*a*-102*n*.

The cooling vent tiles 118 may comprise manually or remotely adjustable vent tiles. In this regard, the cooling vent tiles 118 may be manipulated to vary, for instance, the mass flow rates of cooled air supplied to the heat generating devices 102*a*-102*n*. In addition, the cooling vent tiles 118 may comprise the dynamically controllable vent tiles disclosed and described in commonly assigned U.S. Pat. No. 6,574,104, the disclosure of which is hereby incorporated by reference in its entirety. As described in the U.S. Pat. No. 6,574,104, the cooling vent tiles 118 are termed "dynamically controllable" because they generally operate to control at least one of velocity, volume flow rate and direction of the cooled airflow therethrough. In addition, specific examples of dynamically controllable cooling vent tiles 118 may be found in U.S. Pat. No. 6,694,759, filed on Jan. 27, 2003, which is assigned to the assignee of the present invention and is incorporated by reference herein in its entirety.

The airflow that is heated by the heat generating components 116 and exhausted from the heat generating devices 102*a*-102*n* is depicted in FIG. 1A by the arrows 126. In an ideal situation, all of the heated airflow 126 exhausted from the heat generating devices 102*a*-102*n* is supplied directly back into the AC units 114*a*-114*n* where it is cooled and re-supplied to the heat generating devices 102*a*-102*n*. In many instances, however, the heated airflow 126 does not flow directly back to the heat generating devices 102*a*-102*n*, but instead, mixes with the cooling airflow 120 and is re-circulated back into the heat generating devices 102*a*-102*n*. By way of example, the heated airflow 126 may flow around one or more of the heat generating devices 102*a*-102*n* as illustrated, for instance, by the arrow 128*a*. In addition, the heated airflow 126 may flow back to the inlets of one or more of the heat generating devices 102*a*-102*n* by flowing over one or more of the heat generating devices 102*a*-102*n*. This re-circulation of the heated airflow 126 may reduce the effectiveness of the cooling airflow 120 by increasing the temperature of the cooling airflow supplied to cool the heat generating components 116.

In addition, in many instances, some of the cooling airflow 120 does not flow directly into the heat generating devices 102*a*-102*n*, but instead may flow around or over the heat generating devices 102*a*-102*n*, as indicated by the arrow 128*b*. In these instances, some of the cooling airflow 120 may be lost as some of the cooling airflow 120 may be supplied back into the AC units 114*a*-114*n* prior to absorbing heat from the heat generating devices 102*a*-102*n*.

Positioned at various locations of the room 100 are secondary vent tiles 130*a*-130*n* designed to reduce the adverse effects of the heated airflow 126 re-circulation. In addition, or alternatively, some or all of the secondary vent tiles 130*a*-130*n* may be configured to substantially minimize the amount of cooling airflow 120 lost. In performing one or both of these functions, the secondary vent tiles 130*a*-130*n* may operate to change one or both of the pressure distribution of the re-circulated airflow 128*a*, 128*b* and the temperature of the re-circulated airflow 128*a*, 128*b* around various areas of the room 100. The various areas of the room 100 may comprise areas where adverse re-circulation (re-circulated heated airflow 128*a* or lost cooling airflow 128*b*) is detected. In this regard, for instance, the secondary vent tiles 130*a*-130*n* may strategically be placed in areas of the room 100 where re-circulated airflow 128*a*, 128*b* has been or is known to occur.

Figure 1B:
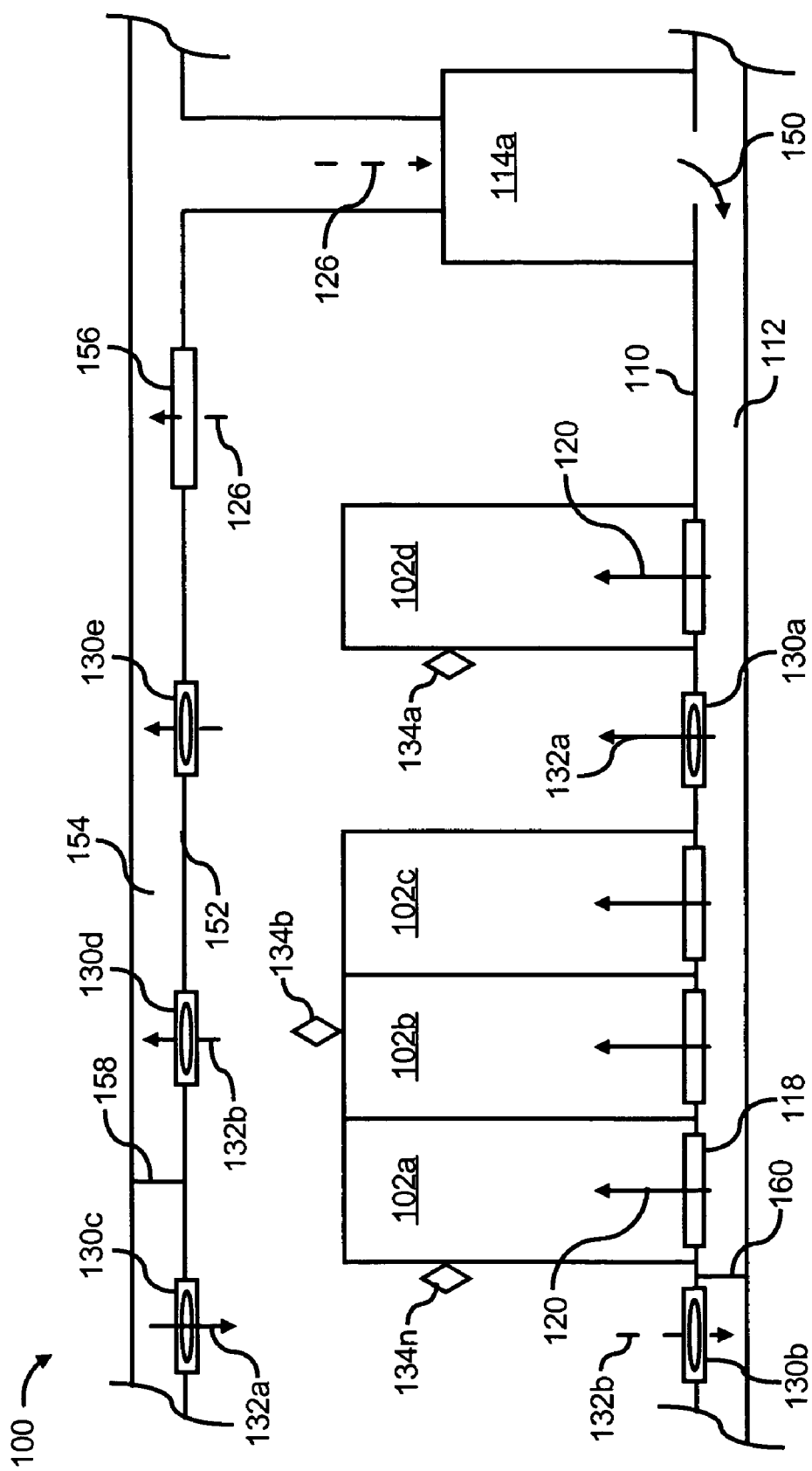
FIG. 1B shows a simplified illustration of a cross-sectional, side elevational view of part of the room shown in FIG. 1A, according to an embodiment of the invention.

The strategic locations of the secondary vent tiles 130*a*-130*n* may include, for instance, areas adjacent to the sides of some of the heat generating devices 102*a*-102*n* (as shown by the secondary vent tiles 130*a*-130*c*), areas adjacent to the fronts of some of the heat generating devices 102*a*-102*n* (as shown by the secondary vent tile 130d), areas adjacent to the rears of some of the heat generating devices 102a-102n (as shown by the secondary vent tile 130n), and areas nonadjacent to the heat generating devices 102a-102n (for instance, areas in a lowered ceiling of the room as shown in FIG. 1B, areas in a wall of the room 100 (not shown), etc.).

In a first example, the secondary vent tiles 130a-130n may introduce a control airflow 132a into the re-circulated airflow 128a. In this example, the control airflow 132a may be introduced into the re-circulated airflow 128a to at least one of change the pressure distribution of the re-circulated airflow 128a and change the temperature of the re-circulated airflow 128a. In the first instance, the pressure distribution of the re-circulated airflow 128a may be changed to substantially cause the re-circulated airflow 128a to be diverted away from the inlets of the heat generating devices 102a-102n. In the second instance, the control airflow 132a may comprise a relatively lower temperature as compared to the re-circulated airflow 128a. In this regard, the temperature of the re-circulated airflow 128a may be reduced prior to being supplied into the heat generating devices 102a-102n, to thereby reduce some of the adverse effects of re-circulating the heated airflow 126 back into the heat generating devices 102a-102n.

In a second example, the secondary vent tiles 130a-130n may operate to divert some or all of the re-circulated airflow 128a, 128b. If the re-circulated airflow 128a comprises the heated airflow 126, the secondary vent tiles 130a-130n may operate to cause some or all of the re-circulated airflow 128a to be suctioned away from the inlets of the heat generating devices 102a-102n, as indicated by the arrow 132b. The diverted airflow may be separated from the cooling airflow contained in the space 112 through, for instance, the use of tubing (not shown). The tubing may additionally be positioned, for instance, to direct the diverted airflow to one or more of the AC units 114a-114n. If the re-circulated airflow 128b comprises the cooling airflow 120, the secondary vent tiles 130a-130n may operate to cause some or all of the re-circulated airflow 128b to be suctioned away from the hot aisles 124. In this instance, the re-circulated airflow 128b may be reintroduced into the space 112 and therefore back through the cooling vent tiles 118 to be supplied into the heat generating devices 102a-102n.

In any of the examples above, the secondary vent tiles 130a-130n may have one or more fans 136 associated with their operations. For instance, the secondary vent tiles 130a-130n may each be positioned along a plenum having one or more fans operable to change the pressure in the plenum, thereby changing the pressures near the exhausts of the secondary vent tiles 130a-130n. In this instance, the secondary vent tiles 130a-130n may include vanes (not shown) configured to enable control over the flow rate at which air flows into or out of the secondary vent tiles 130a-130n. In another example, the secondary vent tiles 130a-130n may each include controllable fans 136. Examples of suitable secondary vent tiles 130a-130n may also be found, for instance, in U.S. Pat. No. 6,694,759.

The secondary vent tiles 130a-130n may also be operated based upon conditions detected by one or more airflow detection devices 134a-134n, which are generally denoted by diamonds in FIG. 1A. As shown, the airflow detection devices 134a-134n are positioned at various locations in the room 100. More particularly, the airflow detection devices 134a-134n may be positioned in areas of the room 100 where re-circulation airflow 128a, 128b is or has been known to occur. As such, for example, the airflow detection devices 134a-134n may be positioned at the ends of the rows 102-108, near the tops of one or more of the devices 102a-102n, at the sides of one or more devices 102a-102n, etc. The airflow detection devices 134a-134n may be supported at the various locations through use of any reasonably suitable known supporting devices, such as, mechanical fasteners, adhesives, etc.

Generally speaking, the airflow detection devices 134a-134n may operate to detect or display one or both of the direction and speed of the airflow in the respective vicinities of the airflow detection devices 134a-134n. This information may be used to determine whether and where airflow re-circulation is occurring in the room 100.

In a first example, the airflow detection devices 134a-134n may comprise vane-type anemometers configured to detect the direction and speed at which airflow is flowing around the airflow detection devices 134a-134n. In this example, the detected direction and speed of airflow may be used to determine whether airflow is flowing in the desired direction and the desired speed.

In a second example, the airflow detection devices 134a-134n may comprise airflow indicating devices, such as those depicted and described in commonly assigned and co-pending U.S. patent application Ser. No. 10/780,631, entitled "Airflow Detection System Having an Airflow Indicating Device", and filed on Feb. 19, 2004, the disclosure of which is hereby incorporated by reference in its entirety. As described in that application, the airflow indicating devices may be configured to display the direction in which airflow is flowing. In addition, certain of the airflow indicating devices may also display the speed at which the airflow is flowing, for instance, based upon the level of offset in the airflow indicating devices. As also described in that application, cameras positioned at various locations in the room 100 may image the airflow indicating devices. The images of the airflow detection devices may be employed to determine the direction and/or magnitude of the airflow at the locations of the airflow detection devices. This information may also be used to determine whether and where re-circulation is occurring in the room 100.

In a third example, the airflow detection devices 134a-134n may be configured to detect an environmental condition, such as, temperature, pressure, etc., which may be used to calculate airflow direction and speed and thus, airflow re-circulation. For instance, temperature measurements may be used to determine whether re-circulation is occurring at various locations of the room 100. An example of a manner in which an environmental condition may be employed to detect where re-circulation is disclosed in co-pending and commonly assigned U.S. patent application Ser. No. 10/855,400, entitled "Data Center Evaluation Using an Air Re-circulation Index" and filed on May 28, 2004, the disclosure of which is hereby incorporated by reference in its entirety.

Although the airflow detection devices 134a-134n have been illustrated as being positioned at fixed locations in the room 100, the airflow detection devices 134a-134n may also be positioned on a movable platform. An example of a movable platform is the robotic device depicted and described in the patent application Ser. No. 10/780,631. The movable platform may thus be employed to detect re-circulation at a larger number of locations in the room 100 as compared to the fixed airflow detection devices 134a-134n.

Also shown in FIG. 1A is a controller 140 configured to perform various functions in the room 100. As described in greater detail herein below, the controller 140 may employ information obtained from the airflow detection devices 134a-134n in controlling the secondary vent tiles 130a-130n. Although the controller 140 is illustrated in FIG. 1A as comprising a component separate from the components 116 housed in the heat generating devices 102a-102n, the controller 140 may comprise one or more of the components 116 without departing from a scope of the room 100 disclosed herein. In addition, or alternatively, the controller 140 may comprise software configured to operate on a computing device, for instance, one of the components 116.

The room 100 is illustrated in FIG. 1A as containing four rows 102-108 of heat generating devices 102a-102n and two AC units 114a-114n for purposes of simplicity and illustration. Thus, the room 100 should not be construed as being limited in any respect to the number of heat generating devices 102a-102n and AC units 114a-114n illustrated in FIG. 1A. In addition, although the heat generating devices 102a-102n have all been illustrated similarly, the heat generating devices 102a-102n may comprise heterogeneous configurations. For instance, the heat generating devices 102a-102n may be manufactured by different companies or the heat generating devices 102a-102n may be designed to house differing types of components 116, for example, horizontally mounted servers, bladed servers, etc.

With reference now to FIG. 1B, there is shown a simplified illustration of a cross-sectional, side elevational view of a section of the room 100 shown in FIG. 1A. In FIG. 1B, heat generating devices 102a-102d and AC unit 114a are depicted. The AC unit 114a generally operates to cool heated airflow, which is received from the room 100 as indicated by the arrows 126. Generally speaking, the AC unit 114a, as well as the other AC units 114b-114n, may comprise any reasonably suitable and widely available AC unit. For instance, the AC units 114a-114n may comprise vapor-compression type air conditioning units, chiller type air conditioning units, etc. Examples of suitable AC units 114a-114n may be found in co-pending and commonly assigned U.S. patent application Ser. No. 10/853,529, filed on May 26, 2004, and entitled "Energy Efficient AC unit Operation," the disclosure of which is hereby incorporated by reference in its entirety.

The cooled airflow from the AC unit 114a is delivered into the space 112 below the raised floor 110 as indicated by the arrow 150. In addition, the cooled airflow is supplied from the space 112 through the cooling vent tiles 118 to the heat generating devices 102a-102n, as indicated by the arrows 120, to thereby cool the components 116 (not shown) housed in the heat generating devices 102a-102n. In cooling the components 116, the airflow flowing through the heat generating devices 102a-102n become heated as indicated by the arrows 126 in FIG. 1A. In an ideal system, all of the heated airflow 126 flows away from the heat generating devices 102a-102n and back to the AC units 114a-114n.

In the example illustrated in FIG. 1B, the room 100 includes a lowered ceiling 152 configured to provide a space 154 or plenum for the heated airflow 126 to be returned to the AC unit 114a. More particularly, the lowered ceiling 152 includes one or more return vent tiles 156 configured to enable the heated airflow 126 to flow into the space 154, and away from the heat generating devices 102a-102d. It should, however, be understood that various examples of the room 100 may be provided without the lowered ceiling 152 while remaining within the scope of the environmental control systems disclosed herein.

Also positioned along the lowered ceiling 152 are a plurality of secondary vent tiles 130c-130e. The secondary vent tile labeled 130c is depicted as directing airflow toward the raised floor 110, as shown by the arrow 132a. As such, airflow from the secondary vent tile 130c may substantially be separated from the space 154, through a divider 158, such that the heated airflow 126 removed from the room 100 is not re-circulated back into the room 100. In addition, a divider 160 may be positioned between the space 112 and the airflow received through operation of the secondary vent tile labeled 130b, to thus substantially prevent heated airflow from being supplied through, for instance, the cooling vent tiles 118.

Moreover, the secondary vent tiles labeled 130d and 130e are depicted as directing airflow from the room 100 and into the space 154, as depicted by the arrows 132b. In this regard, it should be understood that the secondary vent tiles 130a-130c may be configured to either direct airflow into the room 100 or away from the room 100 and may be re-configured as needed or desired.

Figure 2A:
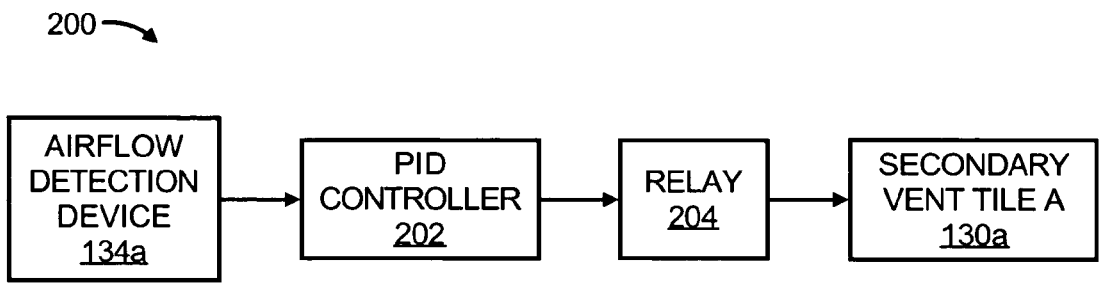
FIG. 2A is a block diagram of a control system for reducing effects of air re-circulation on a local level, according to an embodiment of the invention.

FIG. 2A is a block diagram of a control system 200 for reducing effects of re-circulation on a local level in a room 100. It should be understood that the following description of the block diagram is but one manner of a variety of different manners in which such a control system 200 may be configured. In addition, it should be understood that the control system 200 may include additional components and that some of the components described herein may be removed and/or modified without departing from a scope of the control system 200. For instance, the control system 200 may include any number of airflow detection devices, PID controllers, secondary vent tiles, etc., as well as other components, which may be implemented in the operations of the control system 200.

Generally speaking, the control system 200 may be implemented to substantially control re-circulation at one or more particular areas in a room 100. More particularly, for instance, the control system 200 may be implemented to substantially reduce the adverse effects of air re-circulation at one or more locations in the room 100. In this regard, the control system 200 may provide a relatively simple means for re-circulation control in the room 100.

Condition information from an airflow detection device 134a is transmitted or otherwise sent to a proportional, integral, derivative (PID) controller 202. The PID controller 202 is generally configured to compare the condition information received from the airflow detection device 134a to setpoint conditions, and based upon the comparison, transmit a control signal to a secondary vent tile 130a. In other words, the PID controller 202 may determine an error level in the received data, which the PID controller 202 may convert into a signal, where the signal strength is commensurate with the error level. The PID controller 202 may transmit the signal, via a relay 204, to the secondary vent tile 130a. Based upon the signal strength, the secondary vent tile 130a may vary its operation to thereby airflow introduced into a re-circulating airflow or airflow removed from a re-circulating airflow. Although any suitable PID controller 202 and relay 204 may be utilized with the control system 200, examples of suitable PID controllers 202 include those manufactured by OMEGA Inc. of Stamford, Conn., and WATLOW ELECTRIC MANUFACTURING CO. of St. Louis, Mo.

In one example, the secondary vent tile 130a may include a fan 136 operable to activate when the signal strength is sufficiently high and to deactivate when the signal strength is sufficiently low. In a second example, the fan 136 may operate at multiple speeds commensurate with the signal strength.

Figure 2B:
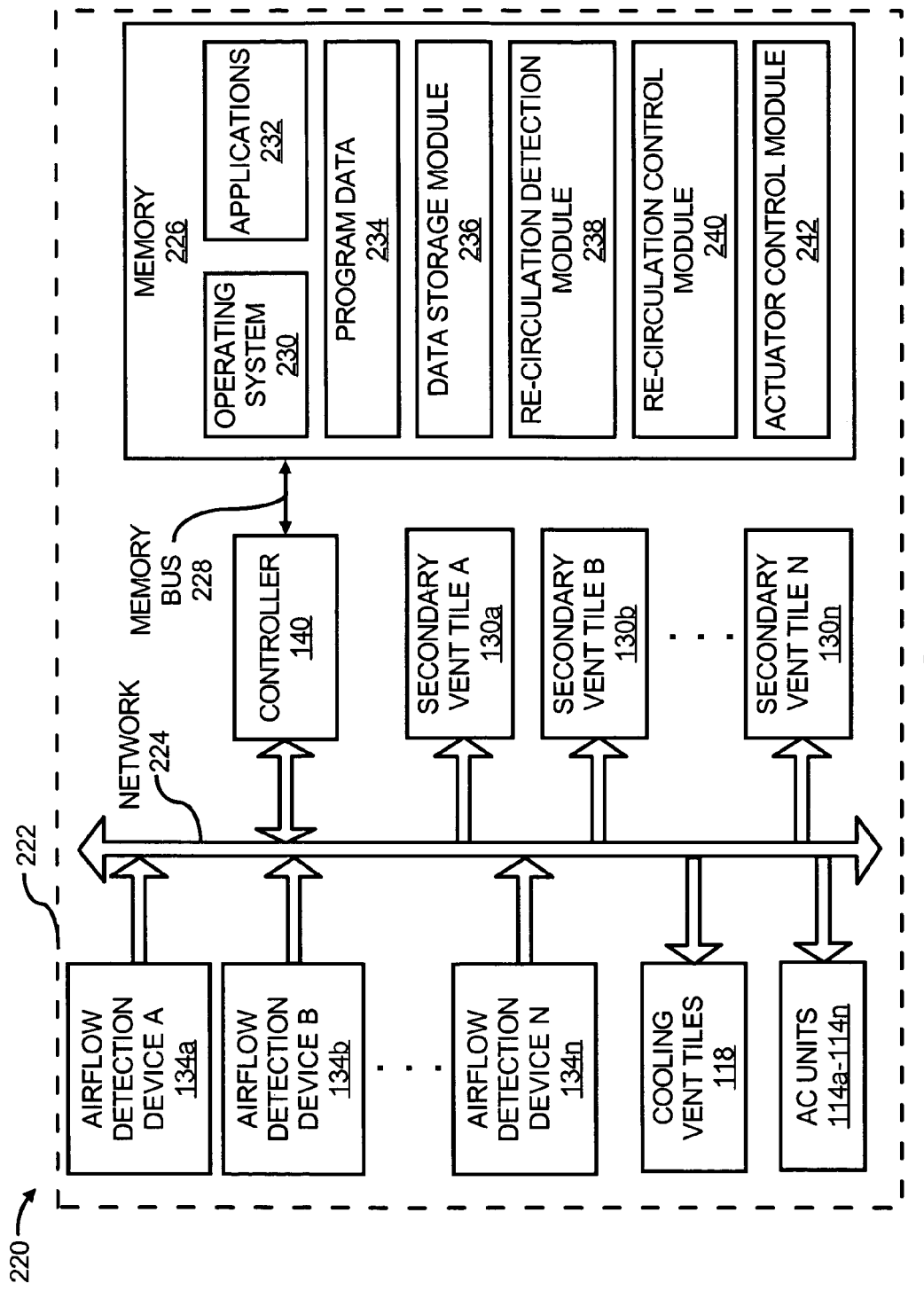
FIG. 2B is block diagram of an environmental control system for controlling environmental conditions in a room, according to an embodiment of the invention.

FIG. 2B is a block diagram 220 of an environmental control system 222 for controlling environmental conditions in a room 100. It should be understood that the following description of the block diagram 220 is but one manner of a variety of different manners in which such an environmental control system 222 may be configured. In addition, it should be understood that the environmental control system 222 may include additional components and that some of the components described herein may be removed and/or modified without departing from a scope of the environmental control system 222. For instance, the environmental control system 222 may include any number of airflow detection devices, cooling vent tiles, secondary vent tiles, etc., as well as other components, which may be implemented in the operations of the environmental control system 222.

Generally speaking, the environmental control system 222 may be implemented to control conditions in a room 100 containing heat generating devices 102a-102n. More particularly, for instance, the environmental control system 222 may be implemented to substantially reduce the adverse effects of air re-circulation in the room 100.

As also discussed above, re-circulation may be detected through use of airflow detection devices 134a-134n positioned at various locations throughout the room 100. Data pertaining to the airflows detected by the airflow detection devices 134a-134n may be transmitted to the controller 140 in accordance with the type of airflow detection device 134a-134n being used in the room 100. A first type of airflow detection device 134a-134n is an airflow detection device that is capable of converting detected conditions into signals that may be transmitted to the controller 140. A second type of airflow detection device 134a-134n is an airflow detection device configured to visually display one or both of the direction and speed of airflow in the vicinity of the airflow detection device. The second type may be imaged by an image capture device, such as a camera or other suitable device (not shown). The captured images may be evaluated by, for instance, the controller 140 to determine one or both of the direction and speed of the airflow around the airflow detection device 134a-134n.

Data from either or both of the airflow detection devices 134a-134n and the image capture devices (not shown) may be transmitted to the controller 140 over a network 224 that operates to couple the various components of the environmental control system 222. Although not shown, the controller 140 may be equipped with or have access to software and/or hardware to enable the controller 140 to transmit and receive data over the network 224. The network 224 generally represents a wired or wireless structure in the room 100 for the transmission of data between the various components of the environmental control system 222. The network 224 may comprise an existing network infrastructure or it may comprise a separate network configuration installed for the purpose of environmental control by the controller 140.

The controller 140 may store the received data in a memory 226 through, for instance, a memory bus 228. However, the memory 226 may form part of the controller 140 without departing from a scope of the environmental control system 222. Generally speaking, the memory 226 may be configured to provide storage of software, algorithms, and the like, that provide the functionality of the controller 140. By way of example, the memory 226 may store an operating system 230, application programs 232, program data 234, and the like. In this regard, the memory 226 may be implemented as a combination of volatile and non-volatile memory, such as DRAM, EEPROM, MRAM, flash memory, and the like. In addition, or alternatively, the memory 226 may comprise a device configured to read from and write to a removable media, such as, a floppy disk, a CD-ROM, a DVD-ROM, or other optical or magnetic media.

The memory 226 also stores a data storage module 236 where the memory 226 may store data pertaining to the airflow detection devices 134a-134n received from the controller 140. In addition, the memory 226 may store a re-circulation detection module 238, which the controller 140 may implement to evaluate the collected data and determine if and where re-circulation of airflow may be occurring in the room 100. The controller 140 may also implement the re-circulation detection module 238 to determine the level at which re-circulation may be occurring and may compare the re-circulation level to a predetermined minimum value. The memory 226 may also store a re-circulation control module 240, which the controller 140 may implement in determining a control scheme for use in determining how one or more actuators may be manipulated to reduce re-circulation in the room 100. The memory 226 may further store an actuator control module 242 configured to control the one or more actuators in accordance with the control scheme determined through implementation of the re-circulation control module 240.

Although not shown, the memory 226 may also store a learning algorithm configured to infer how one or more actuators may be controlled based upon past conditions and behaviors. The learning algorithm may include, for instance, a neural network configured to learn how the one or more actuators are to be manipulated based upon a number of inputs and outputs, such as, the conditions detected by the airflow detection devices 134a-134n.

The controller 140 may implement the actuator control module 242 to control one or more of the secondary vent tiles 130a-130n. More particularly, for instance, the controller 140 may transmit control signals to or more of the secondary vent tiles 130a-130n to vary the respective speeds at which airflow is either directed into or out of the room 100. The control signals may be transmitted over the network 224. In this regard, the secondary vent tiles 130a-130n may also include respective interfaces (not shown) that generally enable data transfer between the secondary vent tiles 130a-130n and the controller 140 over the network 224. The interfaces may comprise any reasonably suitable hardware and/or software capable to enabling the data transfer over the network 224.

In addition, or alternatively, the secondary vent tiles 130a-130n may also include controllers (not shown) configured to control the secondary vent tiles 130a-130n based upon instructions or signals received from the controller 140. In one example, the controller 140 and the controllers of the secondary vent tiles 130a-130n may both comprise proportional, integral, derivative (PID) controllers, for instance, in a cascading PID control arrangement. In this example, the controller 140 may receive signals either directly from the airflow detection devices 134a-134n or via image capture devices, for instance, having magnitudes corresponding to the differences between detected and predefined conditions. The controller 140 may transmit signals to the controllers of the secondary vent tiles 130a-130n according to the magnitudes of the signals received from the airflow detection devices 134a-134n or via image capture devices. In addition, the controllers of the secondary vent tiles 130a-130n may operate the secondary vent tiles 130a-130n according to the magnitudes of the signals received from the controller 140.

The controller 140 may optionally be configured to control operations of the AC units 114a-114n and the cooling vent tiles 118, as depicted in FIG. 2. In one regard, the controller 140 may control the AC units 114a-114n and the cooling vent tiles 118 in manners as disclosed in U.S. Pat. No. 6,574,104. In addition, if the controller 140 is configured to control operations of the AC units 114a-114n and the cooling vent tiles 118, the memory 226 may store additional algorithms (not shown) that the controller 140 may implement in controlling these components.

Figure 3:
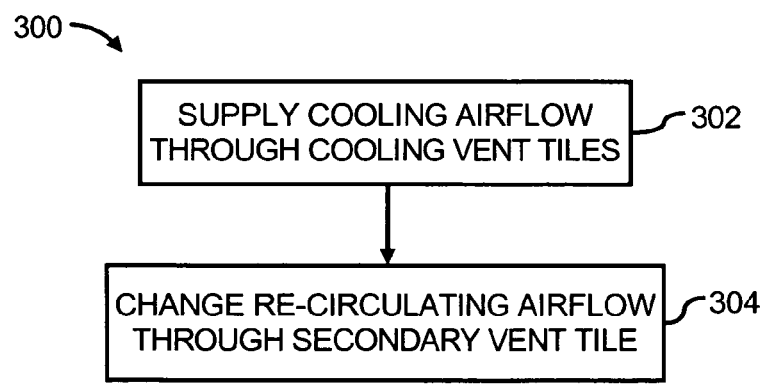
FIG. 3 illustrates a flow diagram of a method for reducing effects of air re-circulation in a room, according to an embodiment of the invention.

FIG. 3 illustrates a flow diagram of a method 300 for reducing effects of air re-circulation in a room 100 containing at least one heat generating component 116, according to an example. It is to be understood that the following description of the method 300 is but one manner of a variety of different manners in which an example of the invention may be practiced. It should also be apparent to those of ordinary skill in the art that the method 300 represents a generalized illustration and that other steps may be added or existing steps may be removed, modified or rearranged without departing from a scope of the method 300.

The description of the method 300 is made with reference to the block diagrams 200 and 220 illustrated in FIGS. 2A and 2B, respectively, and thus makes reference to the elements cited therein. It should, however, be understood that the method 300 is not limited to the elements set forth in the block diagrams 200 and 220. Instead, it should be understood that the method 300 may be practiced by an environmental control system having a different configuration than that set forth in the block diagrams 200 and 220.

The method 300 may be implemented to reduce the effects of air re-circulation through control over one or more secondary vent tiles 130a-130n. In the method 300, cooling airflow may be supplied to the at least one heat generating component 116 through cooling vent tiles 118, as indicated at step 302. In addition, at step 304, a characteristic of re-circulating airflow may be changed through use of at least one secondary vent tile 130a-130n. The characteristic of re-circulating airflow that may be changed includes the temperature and the pressure of the re-circulating airflow. A more detailed description of one or more of the steps outlined in the method 300 is provided below with respect to the method 400 depicted in FIG. 4.

Figure 4:
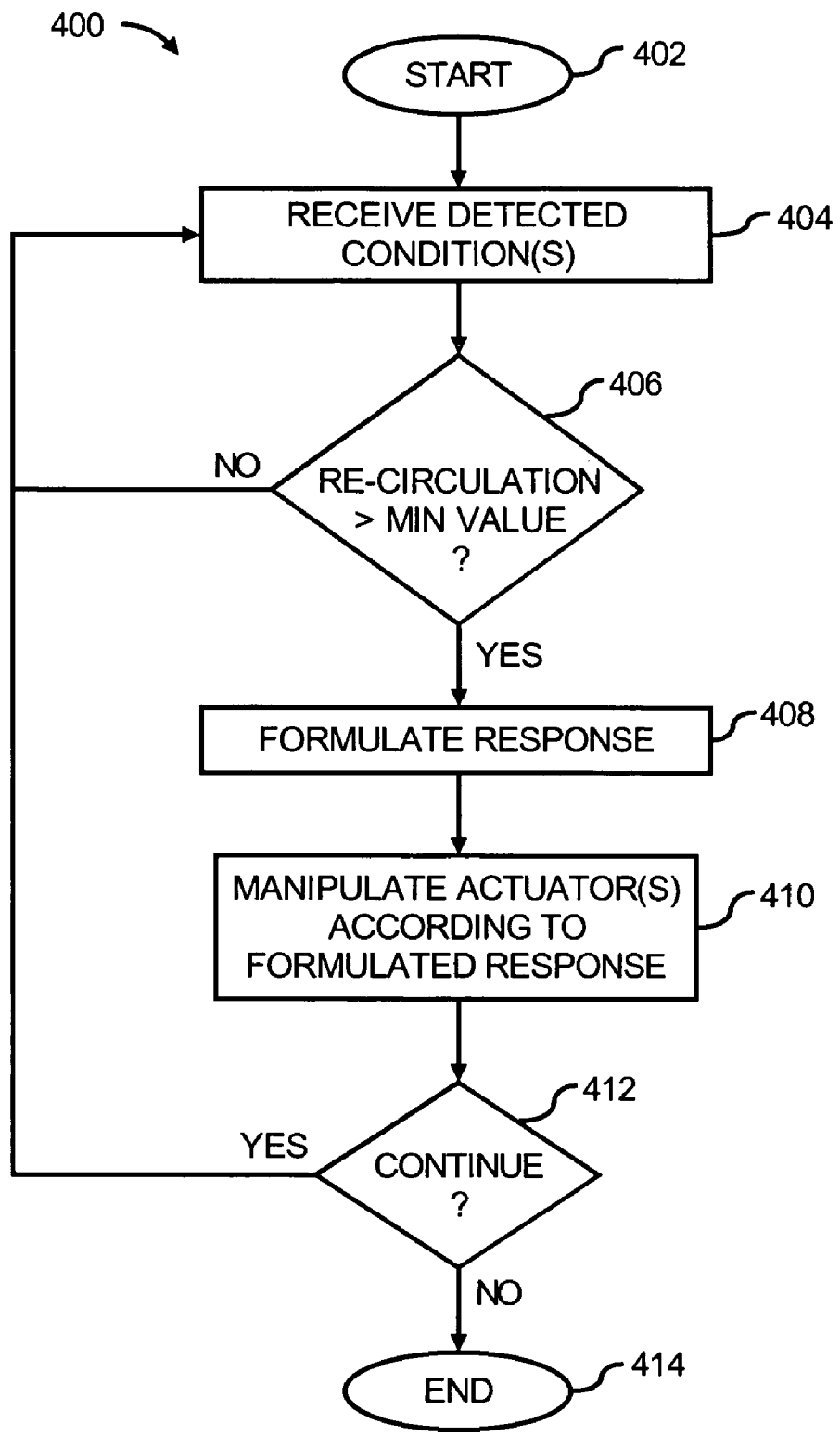
FIG. 4 illustrates a flow diagram of the method depicted in FIG. 3, with a greater level of detail, according to an embodiment of the invention.

With particular reference now to FIG. 4, there is shown a flow diagram of a method 400 for reducing the effects of re-circulation in a room 100, according to an example. It is to be understood that the following description of the method 400 is but one manner of a variety of different manners in which an example of the invention may be practiced. It should also be apparent to those of ordinary skill in the art that the method 400 represents a generalized illustration and that other steps may be added or existing steps may be removed, modified or rearranged without departing from a scope of the method 400.

In addition, the description of the method 400 is made with reference to the block diagram 220 illustrated in FIG. 2B, and thus makes reference to the elements cited therein. It should, however, be understood that the method 400 is not limited to the elements set forth in the block diagram 220. Instead, it should be understood that the method 400 may be practiced by an environmental control system having a different configuration than that set forth in the block diagram 220.

The method 400 may be implemented to control the secondary vent tiles 130a-130n to thereby reduce airflow re-circulation at various locations in a room 100. More particularly, for instance, the secondary vent tiles 130a-130n may be controlled as discussed below to either introduce or remove airflow from the various locations of the room 100.

The method 400 may be initiated at step 402 in response to any of a number of stimuli or conditions. For instance, the method 400 may be initiated with activation of components, such as, the CRAC units 114a-114n, the heat generating components 116, etc. In addition, or alternatively, the method 400 may be manually initiated or the controller 140 may be programmed to initiate the method 400 at various times, for a set duration of time, substantially continuously, etc.

Once initiated, the controller 140 may receive data pertaining to conditions detected by one or more airflow indicating devices 134a-134n, as indicated at step 404. As described above, this data may be directly or indirectly received from the one or more airflow indicating devices 134a-134n. In any regard, the data may pertain to one or both of the direction and magnitude of airflow at various locations of the room 100.

The controller 140 may implement the re-circulation detection module 238 to evaluate the received data and determine if and where airflow re-circulation is occurring, as indicated at step 406. More particularly, for instance, with respect to FIG. 1B, the controller 140 may determine that adverse re-circulation is occurring near the airflow indicating device 134a based upon the direction at which airflow is flowing at that location as indicated by the airflow indicating device 134a. In addition, the controller 140 may determine whether the level of adverse re-circulation exceeds a predetermined minimum value if the controller 140 determines that adverse re-circulation exists. The predetermined minimum value may be set according to levels of re-circulation that may be acceptable and may be based, for instance, upon energy usage consequences of diverting or removing the re-circulating airflow.

If the controller 140 determines that no re-circulation is occurring or that the level of re-circulation is below the predetermined minimum value, the controller 140 may continue to receive and evaluate data pertaining to the detected conditions. However, if the controller 140 determines that re-circulation is occurring above the predetermined minimum value at one or more locations in the room 100, at step 408, the controller 140 may implement the re-circulation control module 240 to formulate a control scheme for one or more actuators, such as, the secondary vent tiles 130a-130n, to reduce adverse effects of the detected re-circulation. In keeping with the example above, the controller 140 may determine that the secondary vent tile 130a may be operated to cause the flow of air in the direction indicated by the arrow 132a to reduce the adverse effects of re-circulation indicated by the airflow indicating device 134a.

In formulating the control scheme at step 408, the controller 140 may also consider whether the determined manipulations of the one or more secondary vent tiles 130a-130n will negatively impact inlet temperatures of airflow supplied into the heat generating devices 102a-102n, such as, by increasing the inlet temperatures or by increasing re-circulation. If the controller 140 determines that such a negative impact may occur, the controller 140 may determine that the one or more secondary vent tiles 130a-130n should not be manipulated. As such, the controller 140 may determine that certain ones of the secondary vent tiles 130a-130n may be manipulated to reduce re-circulation while others of the secondary vent tiles 130a-130n may not be manipulated even though those secondary vent tiles 130a-130n may be manipulated to reduce re-circulation.

At step 410, the controller 140 may implement the re-circulation control module 240 to manipulate one or more of the actuators, such as, the secondary vent tiles 130a-130n, in accordance with the formulated control scheme. As such, for instance, the controller 140 may transmit a control signal to the secondary vent tile 130a to introduce airflow, as indicated by the arrow 132a, into the airflow above the secondary vent tile 130a. In this regard, the secondary vent tile 130 may be operated to at least one of reduce the temperature of the airflow above the secondary vent tile 130 and substantially divert the airflow away from the inlets of the heat generating devices 102a-102n.

Following manipulation of the one or more actuators at step 410, it may be determined as to whether the method 400 is to continue, as indicated at step 412. If a "no" condition is reached at step 412, the method 400 may end as indicated at step 414. The method 400 may end, for instance, following a predetermined length of time, following a predetermined number of iterations, manually discontinued, etc. If a "yes" condition is reached at step 412, the method 400 may continue beginning at step 404. As such, the method 400 may be repeated for a number of times to substantially continuously vary the airflow conditions in the room 100.

In addition, or alternatively, the method 400 may be performed as an initial operation to determine how the secondary vent tiles 130a-130n may be set based upon re-circulated airflows detected in the room 100. In this regard, for instance, the secondary vent tiles 130a-130n may be set in a substantially static manner to generally reduce the adverse effects of re-circulation in the room 100 based substantially upon an initial determination of airflow in the room 100.

Moreover, the method 400 may be performed to determine the locations at which the secondary vent tiles 130a-130n are to be placed in the room 100. Thus, for instance, at step 408, the secondary vent tiles 130a-130n may be placed at various locations in the room 100 where adverse air re-circulation has been detected.

The operations set forth in the methods 300 and 400 may be contained as a utility, program, or subprogram, in any desired computer accessible medium. In addition, the methods 300 and 400 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
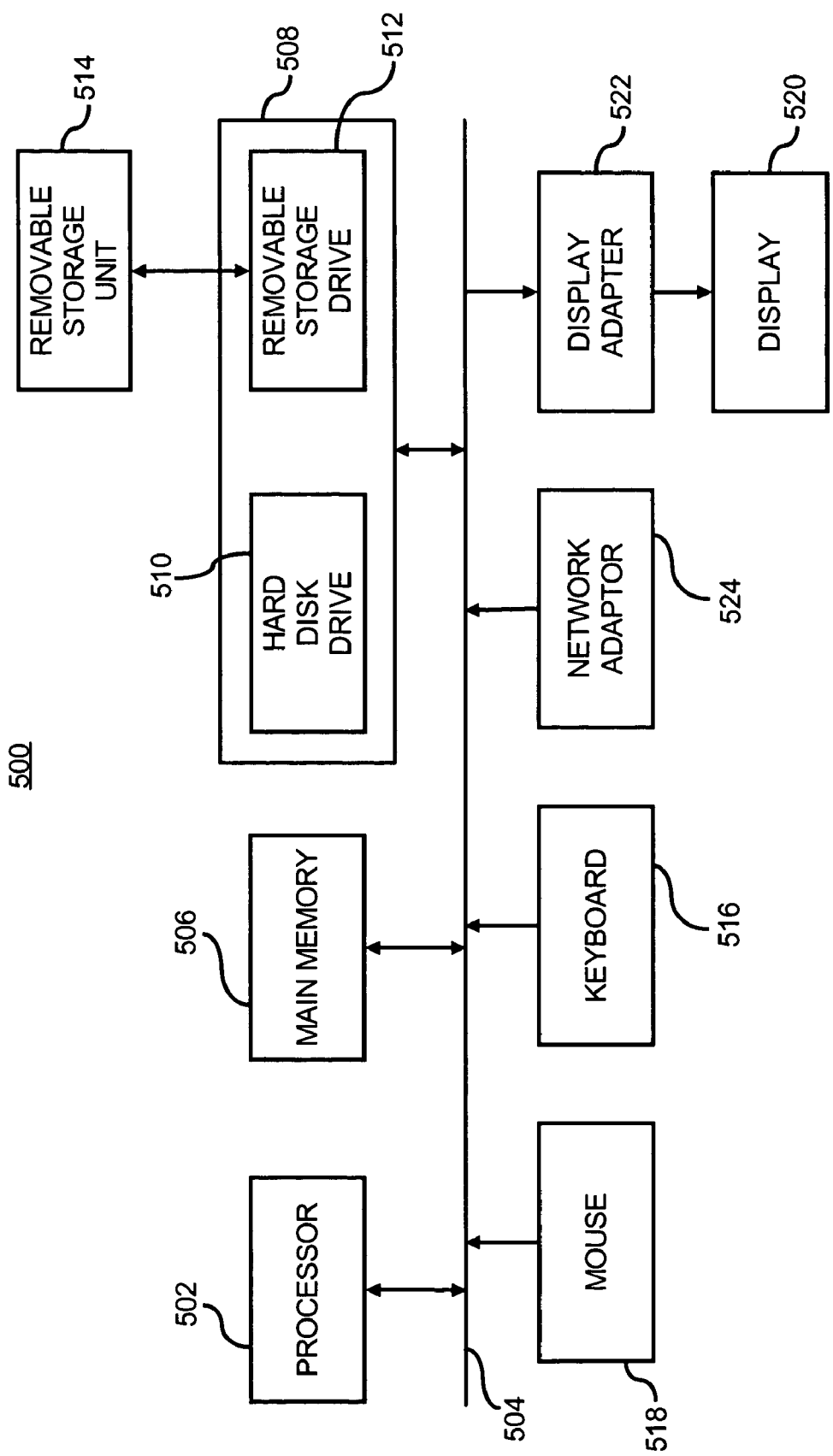
FIG. 5 illustrates a computer system, which may be employed to perform the various functions of the environmental control system, according to an embodiment of the invention.

FIG. 5 illustrates a computer system 500, which may be employed to perform the various functions of the controller 140 described hereinabove, according to an embodiment. In this respect, the computer system 500 may be used as a platform for executing one or more of the functions described hereinabove with respect to the controller 140.

The computer system 500 includes one or more controllers, such as a processor 502. The processor 502 may be used to execute some or all of the steps described in the methods 300 and 400. Commands and data from the processor 502 are communicated over a communication bus 504. The computer system 500 also includes a main memory 506, such as a random access memory (RAM), where the program code for, for instance, the controller 140, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the environmental control system may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, for instance, the Internet, LAN, etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A system for reducing effects of adverse air re-circulation in a room containing at least one heat generating component, said system comprising:

an air conditioning unit configured to cool airflow in the room;

at least one cooling vent tile operable to deliver the cooled airflow to the at least one heat generating component;

at least one secondary vent tile positioned and operated to one of, introduce airflow into a re-circulating airflow and remove airflow from a re-circulating airflow, to thereby respectively divert or vary the temperature of the re-circulating airflow and thereby reduce the effects of air re-circulation in the room;

a plurality of airflow detection devices positioned at a plurality of locations in the room; and a controller configured to receive information regarding airflow at the plurality of locations in the room from the plurality of airflow detection devices, said controller being configured to evaluate the received information to determine whether and where airflow re-circulation is occurring in the room, and wherein the controller is further configured to control the at least one secondary vent tile based upon the determination independently from the at least one cooling vent tile.

2. The system according to claim 1, wherein the at least one secondary vent tile is positioned on at least one of a floor, a wall, and a ceiling of the room.

3. The system according to claim 1, wherein the at least one secondary vent tile comprises a fan, wherein the fan is controllable to vary the amount of pressure applied on the recirculating airflow.

4. The system according to claim 1, wherein the at least one secondary vent tile is operable to introduce airflow into the re-circulating airflow to at least one of vary the temperature of the re-circulating airflow prior to re-entry into the at least one heat generating component and to divert the re-circulating airflow away from an inlet of the at least one heat generating component.

5. The system according to claim 1, wherein the at least one secondary vent tile is operable to remove airflow from the re-circulating airflow to substantially reduce an amount of airflow re-circulated into at least one of an inlet of the at least one heat generating component and an inlet of the air conditioning unit.

6. The system according to claim 1, wherein the airflow detection device comprises at least one of a vane type anemometer and an airflow indicating device.

7. The system according to claim 1, wherein the controller comprises a proportional, integral, derivative controller configured to receive condition information from the airflow detection devices, compare the condition information with a setpoint condition to determine an error level, and transmit a control signal corresponding to the error level to the at least one secondary vent tile, wherein the at least one secondary vent tile is configured to operate based upon the control signal.

8. The system according to claim 1, further comprising:
a memory storing a plurality of modules, wherein the controller is configured to implement the plurality of modules in detecting airflow re-circulation at the plurality of locations in the room and in manipulating the at least one secondary vent tile.

9. The system according to claim 1, further comprising:
at least one imaging device configured to image at least one of the plurality of airflow detection devices, wherein the information regarding the airflow includes an image of the at least one of the plurality of airflow detection devices, and wherein the controller is configured to evaluate the image to determine whether air re-circulation is occurring at the location of the at least one of the plurality of airflow detection devices.

10. A method for reducing effects of air re-circulation in a room containing at least one heat generating component, said method comprising:
supplying cooling airflow to the at least one heat generating component through a cooling vent tile;
detecting at least one condition through use of one or more airflow detection devices;
evaluating the detected at least one condition to determine whether and where air re-circulation is occurring in the room;
formulating a response of how at least one of the secondary vent tiles is to be manipulated in response to a determination that air re-circulation is occurring at one or more of the plurality of locations; and
changing at least one of a pressure distribution and a temperature of airflow around at least one area of the air re-circulation through one of airflow addition into the at least one area of air re-circulation and airflow removal from the at least one area of air re-circulation through use of at least one secondary vent tile in accordance with the formulated response.

11. The method according to claim 10, further comprising:
controlling the at least one secondary vent tile independently from the cooling vent tile.

12. The method according to claim 10, further comprising:
transmitting information pertaining to the detected at least one condition to a controller;
in the controller, comparing the condition information with a setpoint condition to determine an error level, transmitting a control signal corresponding to the error level to the at least one secondary vent tile to change at least one of a pressure distribution and a temperature of airflow around the at least one area of air re-circulation.

13. The method according to claim 12, wherein the error level corresponds to a level of air re-circulation, and wherein the step of changing at least one of a pressure distribution and a temperature of airflow further comprises changing at least one of a pressure distribution and a temperature of the airflow when the error level exceeds a predetermined level.

14. The method according to claim 10, wherein the one or more airflow detection are devices positioned at a plurality of locations in the room, wherein changing the at least one of a pressure distribution and a temperature of airflow further comprises:
transmitting control signals to the at least one secondary vent tile to change at least one of a pressure distribution and a temperature of airflow affected by the at least one secondary vent tile based upon the formulated response to change the at least one of the pressure distribution and temperature of the airflow.

15. The method according to claim 10, further comprising:
determining a level of air re-circulation occurring at one or more locations in the room;
comparing the level of air re-circulation with a predetermined minimum value; and
wherein the step of formulating a response further comprises formulating a response of how at least one of the secondary vent tiles is to be manipulated in response to the determined level of air re-circulation exceeding the predetermined minimum value.

16. The method according to claim 10, wherein the step of detecting at least one condition further comprises detecting the at least one condition with at least one of a vane type anemometer and an airflow indicating device.

17. The method according to claim 16, wherein the step of detecting the at least one condition with an airflow indicating device further comprises imaging the airflow indicating device and transmitting an image of the airflow indicating device to a controller configured to control the at least one secondary vent tile.

18. The method according to claim 10, wherein the step of changing further comprises changing a pressure distribution of airflow, said step of changing a pressure distribution of airflow further comprising removing airflow through use of the at least one secondary vent tile, said method further comprising:
detecting a location of cooled airflow loss;
removing the lost cooled airflow through the at least one secondary vent tile; and
re-supplying the removed lost cooled airflow through the cooling vent tile.

19. The method according to claim 10, wherein the step of changing further comprises changing at least one of a pressure distribution and a temperature of airflow by physically placing a secondary vent tile to vary the airflow at the at least one area of air re-circulation.

20. A system for reducing effects of air re-circulation in a room, said system comprising:
means for cooling airflow in the room;
means for supplying the cooled airflow to at least one heat generating component through use of at least one cooling vent tile;
means for detecting airflow conditions in the room;
means for evaluating the detected airflow conditions to determine whether and where re-circulation is occurring in the room; and
means for varying a characteristic of the detected re-circulating airflow through use of at least one secondary vent tile, wherein the characteristic comprises at least one of airflow pressure and airflow temperature and wherein the means for varying is further configured to control the at least one secondary vent tile independently from the at least one cooling vent tile to vary a characteristic of the detected re-circulating airflow.

21. A computer readable storage medium on which is embedded one or more computer programs, said one or more computer programs implementing a method of reducing effects of air re-circulation in a room, said one or more computer programs comprising a set of instructions for:

applying cooling airflow to the at least one heat generating component through a cooling vent tile;

receiving at least one condition detected through use of one or more airflow detection devices;

evaluating the detected condition to determine whether and where air re-circulation is occurring in the room;

formulating a response of how at least one of the secondary vent tiles is to be manipulated in response to a determination that air re-circulation is occurring at one or more of the plurality of locations; and changing at least one of a pressure distribution and a temperature of airflow around the at least one area of air re-circulation through one of airflow addition into the at least one area of air re-circulation and airflow removal from the at least one area of air re-circulation through control of at least one secondary vent tile in accordance with the formulated response, wherein controlling the at least one secondary vent tile further comprises controlling the at least one secondary vent tile independently of the supply of cooling airflow from the cooling vent tile.

* * * * *

UNITED STATES PATENT AND TRADEMARK OFFICE
CERTIFICATE OF CORRECTION

PATENT NO. : 7,568,360 B1  Page 1 of 1
APPLICATION NO. : 11/264772
DATED : August 4, 2009
INVENTOR(S) : Cullen E. Bash et al.

It is certified that error appears in the above-identified patent and that said Letters Patent is hereby corrected as shown below:

In column 14, line 56-57, in Claim 3, delete "recirculating" and insert -- re-circulating --, therefor.

Signed and Sealed this

Sixteenth Day of March, 2010

David J. Kappos
*Director of the United States Patent and Trademark Office*